(12) United States Patent
Sarwary et al.

(10) Patent No.: US 8,806,401 B1
(45) Date of Patent: Aug. 12, 2014

(54) SYSTEM AND METHODS FOR REASONABLE FUNCTIONAL VERIFICATION OF AN INTEGRATED CIRCUIT DESIGN

(71) Applicant: Atrenta, Inc., San Jose, CA (US)

(72) Inventors: Mohamad Shaker Sarwary, San Diego, CA (US); Maher Mneimneh, San Jose, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/851,763

(22) Filed: Mar. 27, 2013

Related U.S. Application Data

(60) Provisional application No. 61/786,668, filed on Mar. 15, 2013.

(51) Int. Cl.
| | | |
|---|---|---|
| *G06F 17/50* | (2006.01) | |
| *G01R 31/28* | (2006.01) | |
| *G06F 11/00* | (2006.01) | |
| *G06F 11/25* | (2006.01) | |
| *G06F 11/07* | (2006.01) | |
| *G06F 11/263* | (2006.01) | |
| *G06F 11/26* | (2006.01) | |

(52) U.S. Cl.
CPC ........ *G06F 17/5045* (2013.01); *G06F 17/5022* (2013.01); *G06F 11/25* (2013.01); *G06F 11/079* (2013.01); *G06F 11/263* (2013.01); *G01R 31/28* (2013.01); *G06F 11/26* (2013.01); *G06F 11/261* (2013.01)
USPC ............. 716/107; 716/112; 716/136; 703/16; 714/33; 714/37; 714/46; 714/732; 714/741

(58) Field of Classification Search
CPC ... G06F 17/5022; G06F 11/079; G06F 11/25; G06F 11/26; G06F 11/261; G06F 11/263; G06F 17/5045; G01R 31/28
USPC ......... 716/107, 112, 136; 703/16; 714/33, 37, 714/46, 732, 724, 741
See application file for complete search history.

(56) References Cited

U.S. PATENT DOCUMENTS

| | | | |
|---|---|---|---|
| 4,727,545 A * | 2/1988 | Glackemeyer et al. ......... 714/33 |
| 5,465,216 A | 11/1995 | Rotem et al. |
| 6,178,533 B1 | 1/2001 | Chang |
| 6,226,777 B1 | 5/2001 | Zhang |
| 6,321,186 B1 | 11/2001 | Yuan et al. |
| 6,446,243 B1 | 9/2002 | Huang et al. |
| 6,449,750 B1 | 9/2002 | Tsuchiya |
| 6,553,524 B1 | 4/2003 | Das |
| 6,691,287 B2 | 2/2004 | Ganesan et al. |

(Continued)

*Primary Examiner* — Phallaka Kik
(74) *Attorney, Agent, or Firm* — Thomas Schneck; Mark Protsik

(57) ABSTRACT

A system and methods for reasonable formal verification provides a user with coverage information that is used for verification signoff. The coverage is calculated based on formal analysis techniques and is provided to the user in terms of design-centric metrics rather than formal-centric metrics. Design-centric metrics include the likes of a number of reads from or writes to memories and a number of bit changes for counters, among many others. Accordingly, a setup for failure (SFF) function and a trigger the failure (TTF) function take place. During SFF formal analysis is applied in an attempt to reach a set of states close enough to suspected failure states. During TTF formal analysis is applied, starting from the SFF states, to search for a state violating a predetermined property. If results are inconclusive the user is provided with a design-centric coverage metric that can be used in signoff.

27 Claims, 4 Drawing Sheets

(56) References Cited

U.S. PATENT DOCUMENTS

| | | | |
|---|---|---|---|
| 6,925,617 B2 | 8/2005 | Bayraktaroglu et al. | |
| 7,107,553 B2 | 9/2006 | Lockyear et al. | |
| 7,120,829 B2 * | 10/2006 | Shigeta | 714/25 |
| 7,257,786 B1 | 8/2007 | Kukula | |
| 7,283,918 B2 * | 10/2007 | Nozuyama | 702/117 |
| 7,496,788 B1 | 2/2009 | Alfieri et al. | |
| 7,844,873 B2 * | 11/2010 | Funatsu | 714/741 |
| 7,882,473 B2 | 2/2011 | Baumgartner et al. | |
| 7,941,771 B2 | 5/2011 | Kaszynski et al. | |
| 8,127,261 B2 | 2/2012 | Auerbach et al. | |
| 8,140,315 B2 | 3/2012 | Walter et al. | |
| 8,156,462 B2 | 4/2012 | Moon | |
| 8,205,174 B2 | 6/2012 | Li et al. | |
| 8,239,796 B2 | 8/2012 | Stevens et al. | |
| 8,316,332 B1 | 11/2012 | Goyal et al. | |
| 8,321,825 B2 | 11/2012 | Stevens et al. | |
| 2003/0144826 A1 | 7/2003 | Mandell et al. | |
| 2005/0289485 A1 | 12/2005 | Willis | |
| 2006/0041810 A1 * | 2/2006 | Ishida et al. | 714/738 |
| 2006/0271822 A1 * | 11/2006 | Pal et al. | 714/30 |
| 2007/0013403 A1 * | 1/2007 | Nozuyama | 324/765 |
| 2008/0234967 A1 | 9/2008 | Vandewiele et al. | 702/119 |
| 2008/0256404 A1 * | 10/2008 | Funatsu | 714/724 |
| 2009/0210764 A1 * | 8/2009 | Nozuyama | 714/737 |
| 2009/0297019 A1 * | 12/2009 | Zafar et al. | 382/145 |
| 2011/0175643 A1 * | 7/2011 | Bogenberger et al. | 326/21 |
| 2011/0214096 A1 | 9/2011 | Sheeley et al. | |
| 2011/0286656 A1 * | 11/2011 | Kulkarni et al. | 382/144 |
| 2012/0079442 A1 * | 3/2012 | Akar et al. | 716/112 |
| 2012/0131527 A1 | 5/2012 | Kekare | |

* cited by examiner

SYSTEM AND METHODS FOR REASONABLE FUNCTIONAL VERIFICATION OF AN INTEGRATED CIRCUIT DESIGN

CROSS-REFERENCE TO RELATED APPLICATION

The present application claims priority under 35U.S.C. 119(e) from prior U.S. provisional application 61/786,668, filed on Mar. 15, 2013.

TECHNICAL FIELD

The invention generally relates to the field of circuit design verification and particularly to integrated circuit design verification. More particularly the invention relates to a system, method and computer program product for functional verification of an integrated circuit.

BACKGROUND ART

Design verification, the process of validating the functionality of a design against its specification, is a crucial step in today's design flows. Still, today's large system-on-chip (SoC) integrated circuits (ICs) are only partially verified prior to tapeout, i.e., signing-off for preparation of masks and manufacturing, due to the complexities of the designs as well as the time and resources needed to conclude such a daunting task. This complexity forced designers to rely on coverage, design knowledge, and other metrics to decide when to conclude the verification effort and to declare an IC "verified". Formal verification, as opposed to simulation, is an exhaustive verification technique often applied to fully verify specific, local functionality of a well-defined portion of an IC design, for example, a communication protocol. This verification is typically undertaken by verification experts who spend significant efforts to verify a specific aspect of the functionality of a design.

In recent years, major advances in the automatic application of formal verification expanded this technology to register-transfer level (RTL) designers who cannot afford the extensive time, effort and expertise required for verifying their design functionality. Automatic formal verification techniques now apply to various problems including clock-domain crossing (CDC), timing exception, power reduction and verification, and static analysis of RTL design, and can target the verification of thousands of properties in days. While formal verification of complex ICs is exhaustive, it usually requires significant time and memory resources to provide conclusive results. When resources are exhausted, current formal verification flows provide inconclusive results. For some formal engines, some information on the depth of analysis might be provided to the user. This information is usually insufficient for the user to make an educated decision on whether to increase system resources or to assume that the system is "reasonably" verified.

For example, formal CDC verification has produced mixed results. On one hand, it can detect functional failures and report them. On the other hand, it is time consuming, since a major effort is required to understand, debug and close any kind of failure reported. The difficulty stems from the fact that CDC verification requires structural as well as functional verification. Synchronization involves structure as well as functionality and both must be properly verified before a tapeout can take place. Incorrectly waiving a reported failure might result in missing a design bug that will manifest itself when the manufactured IC is tested or deployed within a system.

When current automatic formal verification flows exhaust allocated memory and time resources, they provide inconclusive results. This indicates that the analysis was not able to find a design defect, but at the same time it was not able to cover the full state space. As side information, some flows provide the depth to which the analysis was carried. While this information is useful, it is very hard for designers using automatic formal verification flows to correctly interpret this information and decide whether the property can be waived. This is due to the fact that this information is formal analysis-centric.

There is therefore a need in the art for a functional verification solution that can provide the user with design-centric metrics that can be used to catch real design problems. Furthermore, it would be advantageous if such a solution executes in a reasonable amount of time and resource. Such a solution should go beyond the results provided by prior art formal approaches and guide the designer of an IC while analyzing inconclusive properties.

SUMMARY DISCLOSURE

A system and computerized method are provided for performing a reasonable functional verification of the design of an integrated circuit (IC) in which a selected portion of the design of the IC is brought to a target state that is close to a suspected point of failure based on an analysis of a setup for failure property and then functional verification is executed with a number of attempts to trigger the failure property and checking whether a failure is triggered. The functional verification results may be reported as any one or more of a failure to reach the target state, a failure to reach adequate coverage of the attempts to trigger the failure, a property failure being successfully triggered, or a reasonable pass of the IC property being analyzed (i.e., no property failures after adequate coverage of trigger the failure attempts). Adequate coverage is reported as a design-centric metric, such as a ratio of number of trigger the failure operations attempted to a design-specified minimum number of such operations. The functional verification may then proceed to other states of the IC that satisfy the setup for failure and also to other suspected points of failure of the IC. In addition to reporting information sufficient for a user to determine whether or not to sign off on a performed verification, the method can avoid long run times by limiting the verification to bounded analyses focused upon suspected points of failure.

DETAILED DESCRIPTION

A system and methods for reasonable formal verification provides a user with coverage information that is used for verification signoff. The coverage is calculated based on formal analysis techniques and is provided to the user in terms of design-centric metrics rather than formal-centric metrics. Design-centric metrics include the likes of a number of reads from or writes to memories and a number of bit changes for counters, among many others. Accordingly a setup for failure (SFF) function and a trigger the failure (TTF) function take place. During SFF, formal analysis is applied in an attempt to reach a set of states close enough to suspected failure states. During TTF, formal analysis is applied, starting from the SFF states, to search for a state violating a predetermined property. If results are inconclusive the user is provided with a design-centric coverage metric that can be used in signoff.

Formal verification of an integrated circuit (IC) may require significant resources and terminate without providing the designer with conclusive results that either indicate that the design is correct or present a witness that demonstrates a defect in the design. Therefore the system and methods for reasonable formal verification remedy prior art limitations by providing the user with coverage information that can be used for verification signoff in case the results are inconclusive; and, by avoiding long run time by limiting formal verification to bounded analyses only. The guidance is achieved through formal analysis techniques where analysis is applied to drive the design to a state that is close to a failure.

To further appreciate the invention the following non-limiting example may be considered. A first-in first-out (FIFO) memory that is eight (8) stages deep may be checked for overflow. The guided analysis drives the design to the states where there are six (6) or more writes to the memory. The coverage is calculated based on formal analysis techniques and is provided to the user in terms of design-centric metrics rather than formal-centric metrics. For example, for the FIFO example above, if a FIFO overflow check is not conclusive, the method provides coverage metrics in terms of a number of writes that makes the designer confident that the FIFO does not overflow.

The method comprises of a setup for failure (SFF) function and a trigger the failure (TTF) function. During SFF formal analysis is applied in an attempt to reach a set of states close enough to a failure states. During TTF formal analysis is applied starting from the SFF states to search for a state violating a predetermined property. In case the results are inconclusive, this provides the user with design-centric coverage metric that can be used in signoff. Note that both these steps, SFF and TTF require only bounded formal analysis which will reduce run time and computation effort compared to full model checking traditionally used for verification.

Figure 1A:
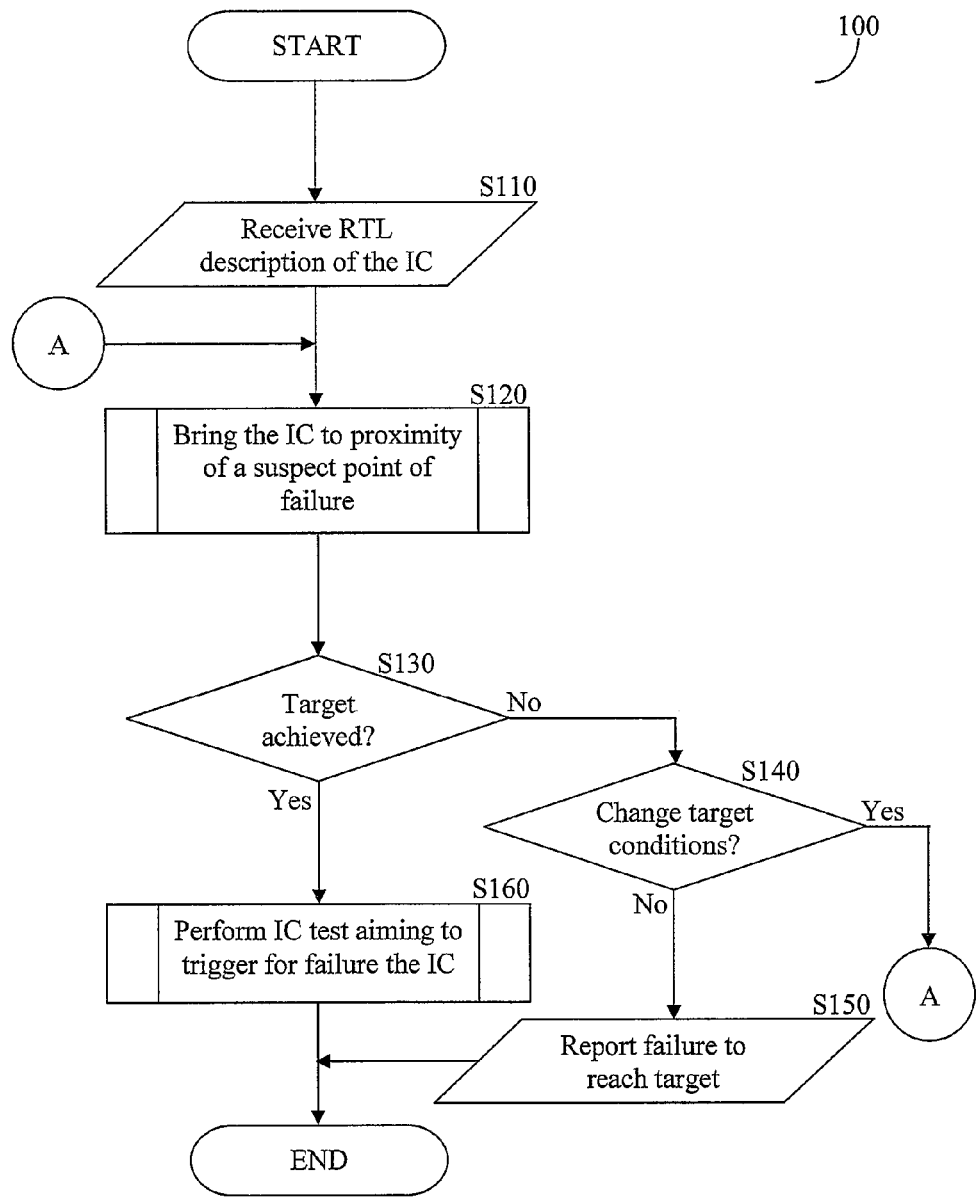
FIG. 1A is an overview flowchart of a computerized method for performing a reasonable formal verification closure according to an embodiment.

Reference is now made to FIG. 1A, which depicts an exemplary and non-limiting overview flowchart 100 of a computerized method for performing a reasonable formal verification closure according to an embodiment. In S110 a description of an integrated circuit (IC), or portion thereof (sub-circuit), is provided. The description may be provided in, but is not limited to, a register-transfer level (RTL) description. In S120 the IC model is brought to the proximity of a suspect or otherwise possible point of failure. For example, in the case of a first-in first-out (FIFO) circuit, such a point may be considered as a point where the FIFO is full at eighty percent of its capacity. So the intent of S120 is to bring the IC, or a portion thereof, to a point after which exercising according to principles of the invention take place. In S130 it is checked whether the target point of proximity was reached and if so, execution continues with S160; otherwise, execution continues with S140. In the exemplary case of the FIFO, failure to bring the tested IC to a point where the FIFO is at least eighty percent full means that the target was not met and corrective actions may be necessary, as further explained herein. In S140 it is checked whether changes to the conditions received are to be entered and if so, execution continues with S120; otherwise, execution continues with S150 where a failure to reach the required proximity target is reported, after which the method terminates. In S160, analysis is performed to trigger a failure and to compute coverage metrics. For the FIFO example, this step attempts to trigger a failure showing a FIFO overflow while counting the maximum number of write operations to the memory. One of ordinary skill in the art would appreciate that knowledge of an inability to reach the target of filling a FIFO to eighty percent capacity may indicate to a skilled designer that logic for writing to the FIFO is defective or that it was difficult to exercise that logic during formal analysis.

Figure 1B:
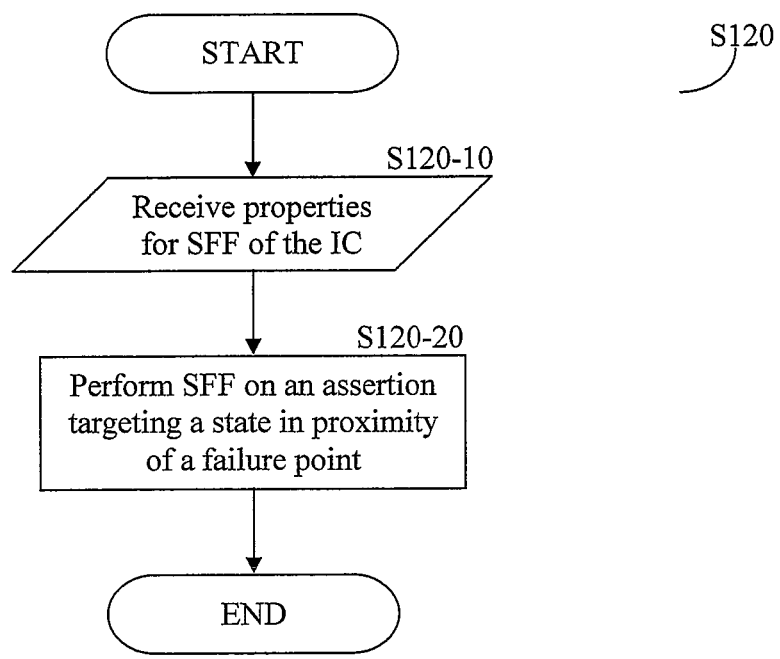
FIG. 1B is a flowchart describing the setup for failure (SFF) portion according to an embodiment.
Figure 1C:
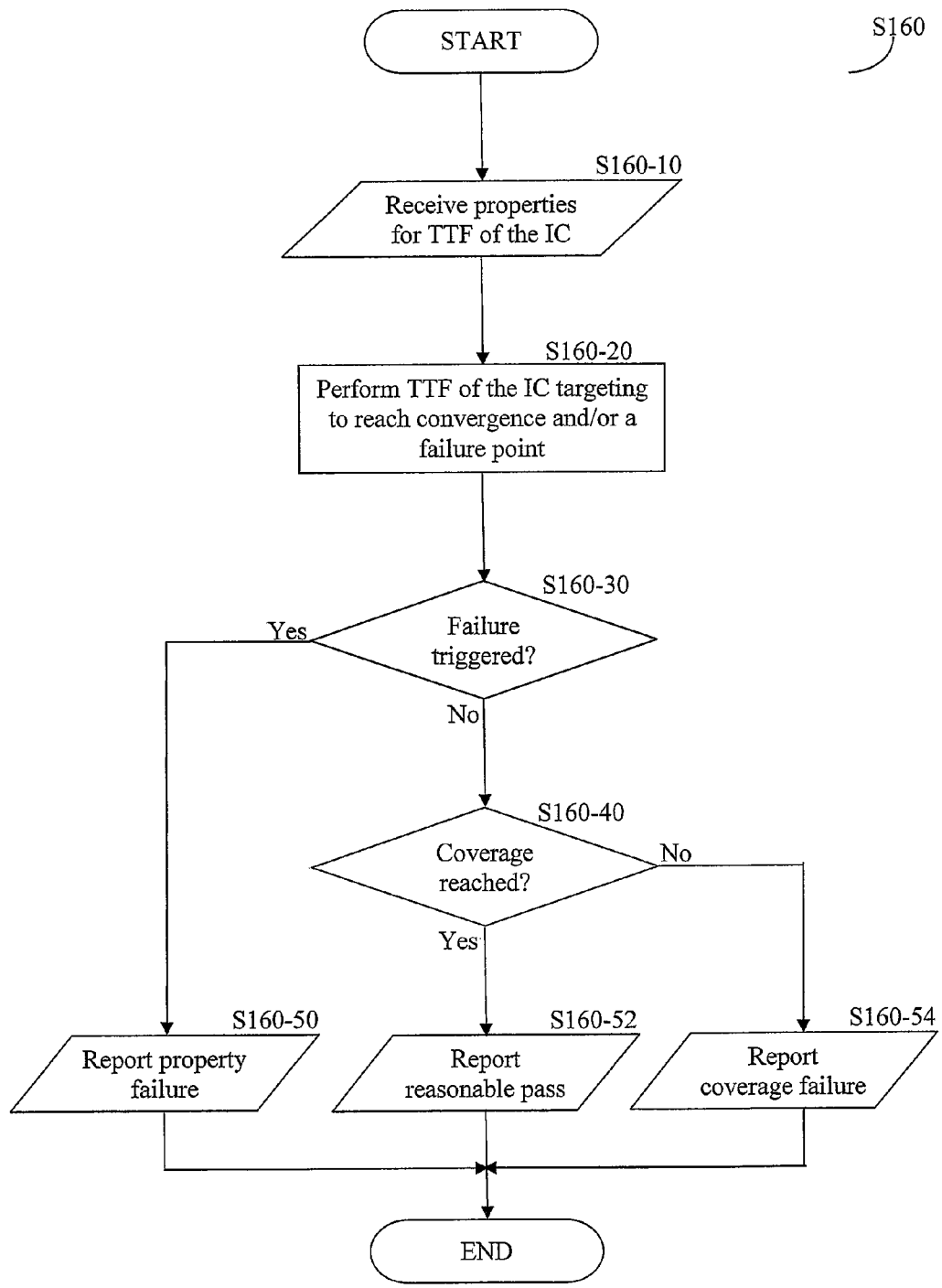
FIG. 1C is a flowchart describing the trigger for failure (TFF) portion according to an embodiment.

FIG. 1B depicts an exemplary and non-limiting flowchart S120 expanding on S120 shown in FIG. 1A. In S112-10 one or more properties that need to be verified are provided. A circuit property, for example but not limited to. CDC related property of the circuit, may be provided in an assertion specification language such as Property Specification Language (PSL) or System Verilog® assertion (SVA), or automatically extracted therefrom. PSL is described in IEC 62531:2012 (IEEE Std. 1850-2010), while SVA is described in IEC 62530:2011 (IEEE Std. 1800-2009) and in a recently approved revision (IEEE Std. 1800-2012). In S120-20 at least a portion of the IC related to the property under verification is selected and is combined with the property to form a model of the problem for functional verification. A set of instructions respective of the portion of the IC detail a setup for failure (SFF) of a property by which the circuit is expected to reach a state close to making the desired property fail. With respect of the FIFO example, a state close to failure may be, for instance and without limitation, a state in which the FIFO is a few write cycles away from overflowing, where an overflow is defined as a successful attempt to write into a FIFO that is already full. The number of data written into the memory which a designer feels would take the memory close to full position is part of the information received in S120-10. As noted above, this number can be expressed as a percentage of the size of the memory, for example 80% of the size of the memory may be set as a state where the FIFO is almost full. Thus the designer is able to define, within the verification process, what is accepted as the criterion for SFF. If such state, deemed by the user to be close to a failure state is not reached, the user is notified and needs to take action. The user can increase the run time or analyze the design for potential issues preventing the 'almost full' state from being reached. If the SFF condition, that may be presented as an instruction, is reached, then a state close to a potential functional failure is reached. It is important to note that multiple states that satisfy the SFF might be found to increase the robustness of the methods disclosed herein. If the desired SFF condition is reached, the IC, or portion thereof, has been properly exercised with regard to a given property. Thereafter, any continuation to further exercise the circuit increases the chance to trigger a failure, which is done as further explained herein with respect of FIG. 1C.

FIG. 1O is an exemplary and non-limiting flowchart S160 expanding on S160 shown in FIG. 1A. Specifically, this sub-method begins from, but is not limited to, the state that satisfies the SFF, and attempts to trigger the failure (TTF). In S160-10, properties, SFF states, and coverage metrics are received. In S160-20 the IC is exercised by a verification tool to attempt to reach the failure or the desired coverage. In S160-30 it is checked whether a failure was triggered. If there was no failure, execution continues with S160-40; otherwise, execution continues with S160-50. In S160-40 it is checked whether at least the predetermined coverage goal has been achieved and if so execution continues with S160-52; otherwise, execution continues with S160-54. In S160-50, a failure of the property is detected and reported to the user. In S160-52, as a failure was not triggered, and a user defined coverage target was reached, then according to the invention reasonable pass is reported after which execution terminates. In S160-54 a failure due to lack of coverage is reported.

A coverage metric for S160-20 can be achieved by implementing the following exemplary and non-limiting method. As an input property is received in S160-10, the designer may define a minimum number of operations (N) to be performed when formal verification takes place. During formal verification, a number of operations (n) is actually performed. The coverage metric is defined as the ratio n/N. In a non-limiting example, a designer may require the verification to perform at least N=20 write cycles into a memory. During verification, n=18 write cycles are performed. Therefore the coverage metric C=18/20, which is 90%. If the coverage metric received in S160-10 defines a, requirement for 90% or above coverage then the target is achieved. However, if the requirement is for 95% coverage, then the coverage metric target was not achieved. This metric may be part of the report of a reasonable pass according to an embodiment.

One of ordinary skill in the art would readily appreciate that the teachings herein of a reasonable formal verification will result in one of four statuses: failure of SFF, failure of the property, a reasonable pass, or a failure due to inadequate coverage. This provides the designer with a rich set of information to conclude verification. For SFF failures, the designer can study the cause of failure and either modify his design to fix defects causing SFF failures or can increase the time of analysis. For a failure of the property, the designer is provided with a witness that demonstrates a manifestation of the bug. For a coverage failure, the designer can increase coverage by increasing the run time or reduce his coverage target to get a reasonable pass. A reasonable pass status, according to an embodiment, means that a pass was reached with appropriate coverage.

Figure 2:
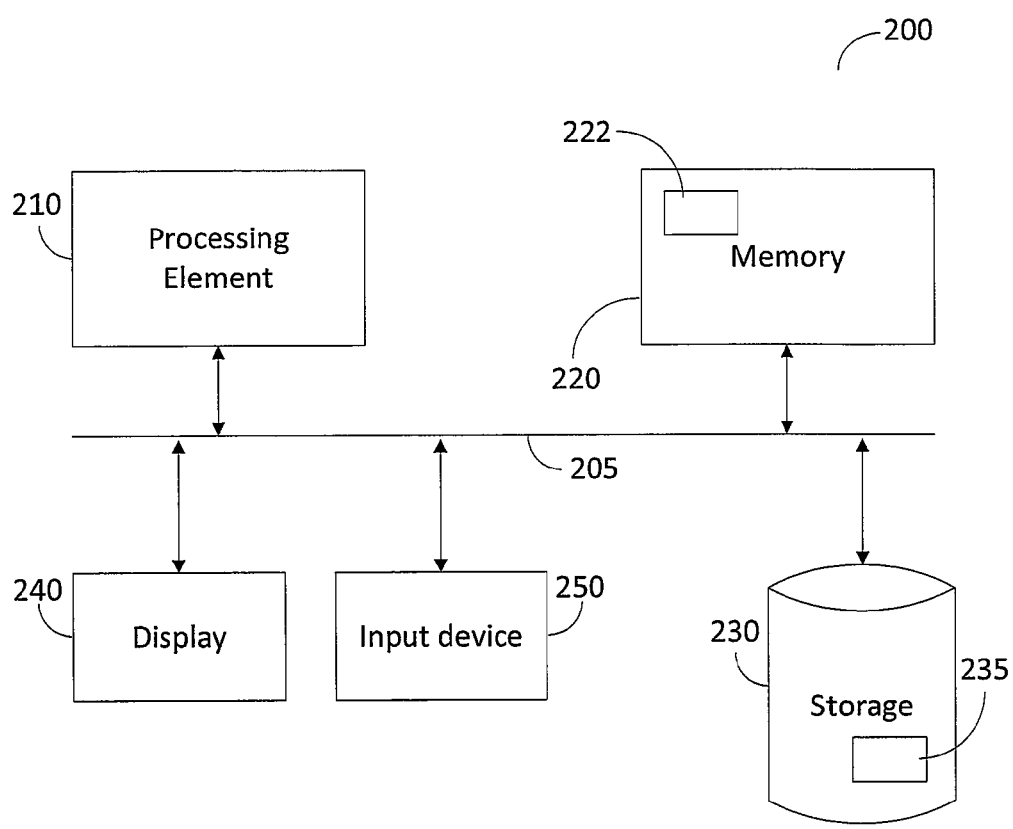
FIG. 2 is a system implemented according to an embodiment.

FIG. 2 shows an exemplary and non-limiting system 200, such as a computer aided design (CAD) system, implemented according to an embodiment. The system 200 comprises a processing element 210, for example, one or more central processing units (CPUs), that is coupled via a bus 205 to a memory 220. The memory 220 further comprises a memory portion 222 that contains instructions that when executed by the processing element 210 performs the method described in more detail herein. The memory 220 may be further used as a working scratch pad for the processing element 210, a temporary storage, and others, as the case may be. The memory 220 may comprise of volatile memory such as, but not limited to, random access memory (RAM), or non-volatile memory (NVM), such as, but not limited to, Flash memory. The processing element 210 may be coupled to a display unit 240, e.g., a computer screen, an input device 250, e.g., a mouse and/or a keyboard, and a data storage 230. Data storage 230 may be used for the purpose of holding a copy of the program instructions for the method executed in accordance with the disclosed technique, and more specifically, the methods shown in FIGS. 1A, 1B and 1C.

Data storage 230 may further comprise storage portion 235 containing the aforementioned abstraction, as well as, but not limited to, the description of the IC, for example in RTL, for example, the RTL description received in S110, including its sub-circuits discussed hereinabove.

The principles of the invention are implemented as hardware, firmware, software or any combination thereof, including but not limited to a CAD system and software products thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

What is claimed is:

1. A method implemented in a programmable system for reasonable functional verification of a design of an integrated circuit (IC), the method comprising:
    retrieving from storage by the programmable system a description of the design of at least a portion of the IC;
    causing the programmable system to bring at least a portion of the IC in the received description to a state close to a suspected point of failure through analysis of a setup for failure (SFF) property;
    executing by the programmable system functional verification of at least a portion of the design of the IC from the suspected point of failure through analysis of a trigger for failure (TFF) property; and
    providing by the programmable system a report respective of a result of the executing of the set of instructions.

2. The method of claim 1, wherein retrieving from storage a description of at least a portion of the design of the IC further comprises selecting the at least a portion of the design of the IC.

3. The method of claim 1, wherein the description is provided in a register-transfer level (RTL) description language.

4. The method of claim 1, wherein to bring at least a portion of the IC in the received description to a state close to a suspected point of failure comprises a bounded checking of the at least a portion of the IC by the programmable system to reach a suspected point of failure which is specific to a property to be verified.

5. The method of claim 1, wherein the property is defined in an assertion specification language.

6. The method of claim 5, wherein the assertion specification language is at least one of property specification language (PSL) and System Verilog® assertion (SVA).

7. The method of claim 1, further comprising determining by the programmable system a coverage metric that is a ratio between a number of operations actually performed for functional verification and a minimum number of operations necessary for a desired level of coverage.

8. The method of claim 7, further comprising reporting by the programmable system the coverage metric.

9. The method of claim 7, further comprising reporting by the programmable system reasonable coverage upon determination that no failure respective of a TFF was detected and coverage is equal to or higher than a predetermined coverage metric.

10. The method of claim 1, further comprising reporting by the programmable system failure upon determination that a failure was detected respective of a TFF.

11. The method of claim 1, further comprising reporting by the programmable system failure for lack of sufficient coverage upon determination that no failure respective of a TFF was detected and coverage is lower than a predetermined coverage metric.

12. The method of claim 1, further comprising reporting by the programmable system failure to reach a desired SFF property.

13. A computer software product containing instructions embodied in a non-transitory tangible computer-readable medium that, when executed by the computer, perform the method of claim 1.

14. A system for reasonable functional verification of a design of an integrated circuit (IC), the system comprising:
   a processing unit;
   a storage coupled to the processing unit; and,
   a memory coupled to the processing unit, the memory containing instructions that when executed by the processing unit: retrieve from storage a description of the design of at least a portion of the IC; bring the at least a portion of the IC in the received description to a state close to a suspected point of failure respective of a setup for failure (SFF) property; execute a set of instructions by functional verification of the at least a portion of the design of the IC from the suspected point of failure respective of at least a trigger for failure (TFF) property; and, providing a report respective of a result of execution of the functional verification.

15. The system of claim 14, wherein the processing unit comprises one or more central processing units.

16. The system of claim 14, wherein the system is a computer aided design (CAD) system.

17. The system of claim 14, wherein the retrieve from storage a description of at least a portion of the design of the IC further comprises a selection of the at least a portion of the design of the IC.

18. The system of claim 14, wherein the description is provided in a register-transfer level (RTL) description language.

19. The system of claim 14, wherein the memory further contains instructions that, when executing by the processing unit, provide for a bounded check to reach a suspected point of failure which is specific to a property to be verified.

20. The system of claim 14, wherein the property is defined in an assertion specification language.

21. The system of claim 20, wherein the assertion specification language is at least one of property specification language (PSL) and System Verilog® assertion (SVA).

22. The system of claim 14, wherein the memory further contains instructions that, when executed by the processing unit, provide for determination of a coverage metric that is a ratio between a number of operations actually performed for function verification and a minimum number of operations necessary for a desired level of coverage.

23. The system of claim 22, wherein the memory further contains instructions that, when executed by the processing unit, provide for a report of the coverage metric.

24. The system of claim 22, wherein the memory further contains instructions that, when executed by the processing unit, provide for a report of reasonable coverage upon determination that the instructions have executed and no failure was detected respective of a TFF property.

25. The system of claim 14, wherein the memory further contains instructions that, when executed by the processing unit, provide for a report of failure respective of a TFF property.

26. The system of claim 14, wherein the memory further contains instructions that, when executed by the processing unit, provide for a report of failure for lack of sufficient coverage upon determination that no failure respective of a TFF property was detected and coverage is lower than a predetermined coverage metric.

27. The system of claim 14, wherein the memory further contains instructions that, when executed by the processing unit, provide for a report of failure to reach a desired SFF property.

* * * * *